(12) United States Patent
Kim et al.

(10) Patent No.: US 11,104,116 B2
(45) Date of Patent: Aug. 31, 2021

(54) METHOD FOR DISMANTLING SOLAR CELL MODULE FOR RECYCLING

(71) Applicant: KOREA UNIVERSITY RESEARCH AND BUSINESS FOUNDATION, Seoul (KR)

(72) Inventors: Donghwan Kim, Seoul (KR); Se Jin Park, Seoul (KR); Hae-Seok Lee, Seoul (KR); Yoon Mook Kang, Seoul (KR); Hyomin Park, Yongin-si (KR); Soohyun Bae, Seoul (KR); Jong Won Ko, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/793,535

(22) Filed: Feb. 18, 2020

(65) Prior Publication Data
US 2020/0180295 A1 Jun. 11, 2020

Related U.S. Application Data

(63) Continuation of application No. PCT/KR2018/000371, filed on Jan. 8, 2018.

(30) Foreign Application Priority Data

Sep. 13, 2017 (KR) .................. 10-2017-0117338

(51) Int. Cl.
*B32B 43/00* (2006.01)
*B32B 7/12* (2006.01)
(Continued)

(52) U.S. Cl.
CPC .............. *B32B 43/006* (2013.01); *B32B 7/12* (2013.01); *B32B 9/005* (2013.01); *B32B 17/06* (2013.01);
(Continued)

(58) Field of Classification Search
CPC ................ B32B 17/06; B32B 2255/20; B32B 2307/202; B32B 2307/412;
(Continued)

(56) References Cited

FOREIGN PATENT DOCUMENTS

| JP | 2017-136516 A | 8/2017 |
| KR | 10-1092259 B1 | 12/2011 |

(Continued)

OTHER PUBLICATIONS

Written Opinion of PCT/KR2018/000371.*
(Continued)

*Primary Examiner* — Sonya M Sengupta
(74) *Attorney, Agent, or Firm* — NSIP Law (57) ABSTRACT

According to one embodiment of the present invention, a method for dismantling a solar cell module for recycling comprises the steps of: providing a silicon solar cell module in which a silicon solar cell element and one side of glass are bonded together by a sealing agent and a transparent conductive material layer is coated between the side of the glass and the sealing agent; applying a high voltage between the transparent conductive material layer and the other side of the glass; and separating the glass and sealing agent by exposing the silicon solar cell module having the transparent conductive material layer discolored by application of the high voltage to a moisture environment.

11 Claims, 6 Drawing Sheets

(51) Int. Cl.
  *B32B 9/00*      (2006.01)
  *B32B 17/06*     (2006.01)
  *H01L 31/048*    (2014.01)

(52) U.S. Cl.
  CPC ...... *H01L 31/048* (2013.01); *B32B 2307/202* (2013.01); *B32B 2307/412* (2013.01); *B32B 2457/12* (2013.01); *Y10T 156/1153* (2015.01)

(58) Field of Classification Search
  CPC ... B32B 2457/12; B32B 27/06; B32B 27/304; B32B 27/322; B32B 27/36; B32B 3/08; B32B 43/006; B32B 7/12; B32B 9/005; H01L 31/022466; H01L 31/0445; H01L 31/048; H01L 31/068; Y02E 10/547; Y10T 156/1153
  See application file for complete search history.

(56) References Cited

FOREIGN PATENT DOCUMENTS

| | | |
|---|---|---|
| KR | 10-2013-0011249 A | 1/2013 |
| KR | 10-1256574 B1 | 4/2013 |
| KR | 10-2015-0120376 A | 10/2015 |
| KR | 10-1680462 B1 | 11/2016 |

OTHER PUBLICATIONS

English translation of JP2017-136516.*
English translation of KR10-2016-0116851.*
English translation of KR2015-0120376.*
International Search Report dated Jun. 4, 2018 in corresponding International Patent Application No. PCT/KR2018/000371 (2 pages in English, 2 pages in Korean).

* cited by examiner

METHOD FOR DISMANTLING SOLAR CELL MODULE FOR RECYCLING

CROSS-REFERENCE TO RELATED APPLICATIONS

This application is a continuation of and claims priority to PCT/KR2018/000371 filed on Jan. 8, 2018, which claims priority to Korea Patent Application No. 10-2017-0117338 filed on Sep. 13, 2017, the entireties of which are both hereby incorporated by reference.

TECHNICAL FIELD

The present disclosure relates to a new structure and method for recycling a solar cell module. More specifically, the present disclosure is directed to a technology for easily recycling a solar cell module by forming a transparent conductive layer between a glass and an encapsulant during manufacturing of the solar cell module and using the transparent conductive layer after life of the solar cell module came to an end.

BACKGROUND

The sunlight is a clean energy source without pollution such as air pollution, noise oscillation, and the like, and is an infinite resource without concern of exhaustion.

A solar cell is a core element of photovoltaic power generation and converts light energy into electrical energy to produce electricity. Conventionally, a solar cell includes a p-type semiconductor and an n-type semiconductor. When light is irradiated to a solar cell, electrons and holes are generated in a semiconductor due to the photoelectric effect. The electrons and the holes migrate due to a potential difference occurring between the p-type semiconductor and the n-type semiconductor, and current flows when a load is connected.

A minimum unit of a solar cell is called a cell, and a plurality of cells are connected and protected with a glass and a frame to form a module. The module is a minimum unit which may obtain required power. In addition, a panel assembled by connecting a plurality of modules in series and in parallel is called an array.

A commercial silicon solar cell module has a structure in which a glass, an encapsulant, a solar cell, an encapsulant, and a back sheet are sequentially stacked.

Currently, solar cells used in photovoltaic power generation are silicon solar cells. The silicon solar cells accounts for about 90% of the global market. Besides the silicon solar cells, inorganic solar cells and organic solar cells have been used.

The photovoltaic power generation market is on an increasing trend every year. However, solar cell modules, which should be disposed of or recycled, are increasing as cumulative installed capacity increases due to photovoltaic power generation. An average lifespan of a silicon solar cell module is up to 30 years, but many modules are disposed of before reaching maximum lifespan thereof due to various reasons such as electrical failure, damage, or natural disaster of the modules. Therefore, the average lifespan is expected to be about 15 to 20 years. Since photovoltaic system supply has rapidly been increased in Korea from 2004 to 2005, the amount of waste solar cell modules is expected to be rapidly increased around 2020. Accordingly, it is important to develop a technology for recycling solar cell modules.

In the solar cell market, supply of silicon is reaching a limit due to a rapid increase in module manufacturing and the price of a solar cell is expected to rise due to poor supply of silicon raw materials. In particular, a price ratio of a module in elements of a solar cell accounts for 60% of overall price, and a cell formed of silicon accounts for 40% of module costs.

Accordingly, there is a need for efforts to address an issue such as short supply of silicon and to reduce solar cell manufacturing costs and waste disposal costs by developing a technology for recovering and regenerating solar cells from waste modules.

In a conventional silicon solar cell module, solar cell elements are connected in series and in parallel, one surface of the silicon solar cell element and a light-transmitting plate is bonded through an encapsulant, and the other surface of the silicon solar cell element and a back sheet are bonded through the encapsulant.

A solar cell module separation process, using a heat treatment of 500 to 600 degrees Celsius, has been performed to dismantle a silicon solar cell module. A silicon solar cell module is divided into respective elements through a separating and refining process after removing an encapsulant through a heat treatment. A separating method, using a heat treatment process, is required to perform refinement and reprocessing for reuse because components are damaged and contaminated during a separating process. In addition, lead included in the solar cell module may be evaporated during a heat treatment of 450 degrees Celsius or higher to generate lead vapor harmful to a human body.

According to Korean Patent Registration No. 10-1256574, a waste solar cell module is immersed in an organic solvent, capable of dissolving an encapsulant, to dismantle a solar cell module. However, such a chemical method requires a lot of time to dismantle a solar cell module.

Accordingly, there is a need for a fast and safe method of separating an encapsulant and a light-transmitting plate.

SUMMARY

An aspect of the present disclosure is to easily dismantle a solar cell module.

According to an aspect of the present disclosure, a method for dismantling a silicon solar cell module includes providing a silicon solar cell module in which a silicon solar cell element and one surface of a glass are bonded by an encapsulant and a transparent conductive material layer is coated between the one surface of the glass and the encapsulant, applying a high voltage between the transparent conductive material layer and the other surface of the glass, and exposing the silicon solar cell module, including the transparent conductive material layer discolored by application of the high voltage, to a moisture environment to separate the glass and the encapsulant.

In an embodiment, the moisture environment may have a relative humidity of 50 to 100 percent.

In an embodiment, the method may further include heating the silicon solar cell module at a temperature of 150 to 250 degrees Celsius.

In an embodiment, the transparent conductive material layer may be applied with a negative voltage and the other surface of the glass may be applied with a positive voltage, and the high voltage may be 100 volts to 1000 volts.

In an embodiment, the method may further include removing the encapsulant and a back sheet on an edge from the silicon solar cell module before applying the high voltage between the transparent conductive material layer and the other surface of the glass.

In an embodiment, the method may further include removing the encapsulant from the silicon solar cell module from which the glass is separated.

In an embodiment, in the applying a high voltage between the transparent conductive material layer and the other surface of the glass, a voltage may be directly applied to the other surface of the glass or the transparent conductive material layer, or a voltage may be directly applied to the other surface of the glass and the silicon solar cell element.

According to another aspect of the present disclosure, a silicon solar cell module includes a silicon solar cell element, a glass covering one surface of the silicon solar cell element, a first adhesive layer disposed between the one surface of the silicon solar cell element and the glass, a transparent conductive material layer disposed between the first adhesive layer and the glass, a back sheet covering the other surface of the silicon solar cell element, and a second adhesive layer disposed between the other surface of the silicon solar cell element and the back sheet.

In an embodiment, the transparent conductive material layer may have an exposed region which is not covered with the first adhesive layer.

According to another aspect of the present disclosure, a method for dismantling a thin-film type solar cell module, including a transparent material layer and a semiconductor layer sequentially stacked on a glass substrate, includes applying a high voltage between the transparent conductive material layer and an exposed surface of the glass substrate and exposing the thin-film type silicon solar cell module, including the transparent conductive material layer discolored by application of the high voltage, to a humid environment to separate the glass substrate and the semiconductor layer.

In an embodiment, the humidity environment may have a relative humidity of 50 to 100 percent.

In an embodiment, the method may further include heating the thin-film type solar cell module at a temperature of 150 to 250 degrees Celsius while applying a high voltage between the transparent conductive material layer and the other surface of the glass substrate.

In an embodiment, the transparent conductive material layer may be applied with a negative voltage and the other surface of the glass substrate may be applied with a positive voltage, and the high voltage may be 100 volts to 1000 volts.

BRIEF DESCRIPTION OF THE DRAWINGS

The above and other aspects, features, and advantages of the present disclosure will be more clearly understood from the following detailed description, taken in conjunction with the accompanying drawings.

DETAILED DESCRIPTION

A method for dismantling a silicon solar cell module according to an embodiment uses a structure in which a transparent conductive material layer is coated on one surface of glass by modifying a structure of a conventional solar cell module. The transparent conductive material layer is modified and peeled off by a high voltage applied between the transparent conductive material layer and the other surface of the glass during a dismantling operation.

When a silicon solar cell module according to an embodiment is manufactured, a transparent conductive material layer is deposited on glass. The solar cell module has a structure in which the glass, the transparent conductive material layer, an encapsulant, a silicon solar cell element, an encapsulant, and a back sheet are sequentially stacked. When the silicon solar cell module is wasted, the glass and the encapsulant are separated by applying a high voltage to the transparent conductive material layer and the other surface of the glass and exposing the waste module to a moisture environment to decompose the transparent conductive material layer.

Hereinafter, embodiments will be described in detail with reference to the accompanying drawings. While the disclosure is subject to various modifications and alternative forms, specific embodiments thereof are shown by way of example in the drawings and are explained in detail in the description. However, the disclosure should not be construed as being limited to the embodiments set forth herein, but on the contrary, the disclosure is intended to cover all modifications, equivalents, and alternatives falling within the spirit and scope of the embodiments. In the drawings, the sizes or shapes of elements may be exaggerated for convenience and clarity of description.

It may be understood that, although the terms "first," "second," etc. may be used herein to describe various elements, these elements are not to be construed as being limited by these terms. These terms are generally only used to distinguish one element from another. In addition, terms particularly defined in consideration of the construction and operation of the embodiments are used only to describe the embodiments, but do not define the scope of the embodiments.

It will be understood that when an element is referred to as being "on" or "under" another element, it can be directly on/under the element, or one or more intervening elements may also be present. When an element is referred to as being "on" or "under," "under the element" as well as "on the element" can be included based on the element.

In addition, relational terms, such as "on/upper part/above" and "under/lower part/below," are used only to distinguish between one subject or element and another subject or element, without necessarily requiring or involving any physical or logical relationship or sequence between the subjects or elements.

Figure 1:
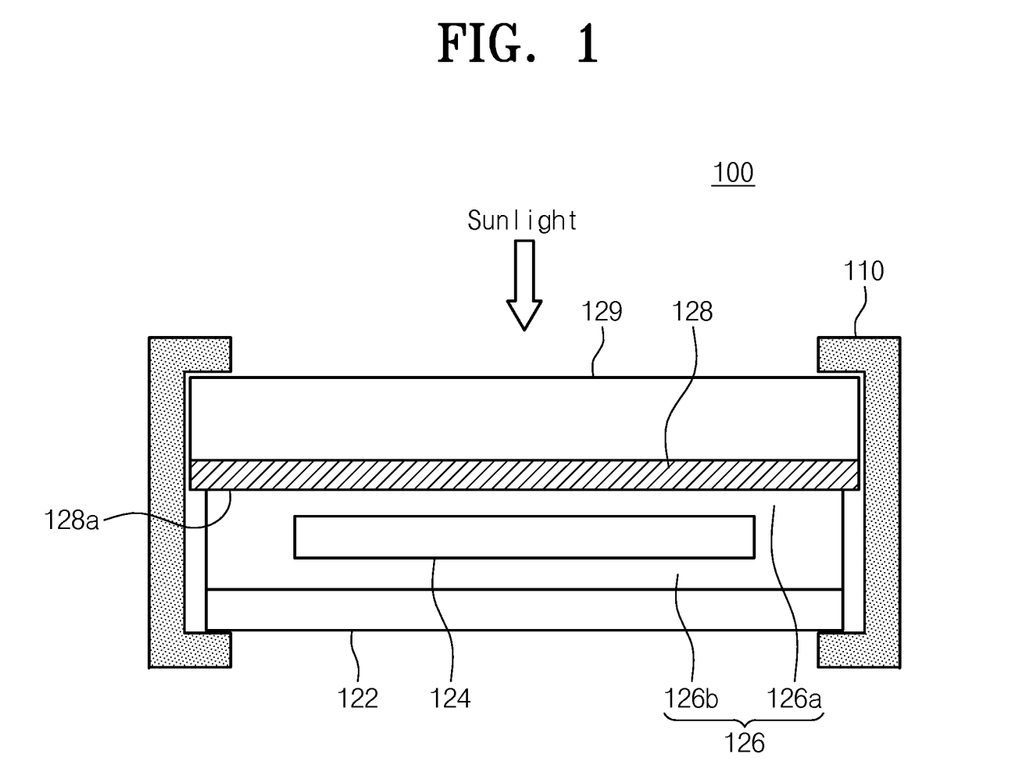
FIG. 1 illustrates a silicon solar cell module according to an embodiment of the present disclosure.

FIG. 1 illustrates a silicon solar cell module according to an embodiment of the present disclosure.

Referring to FIG. 1, a silicon solar cell module 100 includes a silicon solar cell element 124, a glass 129 covering one surface of the silicon solar cell element 124, a first adhesive layer 126a disposed between the one surface of the silicon solar cell element 124 and the glass 129, a transparent conductive material layer 128 disposed between the first adhesive layer 126a and the glass 129, a back sheet 122 covering the other surface of the silicon solar cell element 124, and a second adhesive layer 126b disposed between the other surface of the silicon solar cell element 124 and the back sheet 122. The transparent conductive material layer 128 may have an exposed region which is not covered with the first adhesive layer 126a.

When the silicon solar cell module 100 is manufactured, the transparent conductive material layer 128 is deposited on the glass 129. The silicon solar cell module 100 has a structure in which the glass 129, the transparent conductive material layer 128, the first adhesive layer 126a, the silicon solar cell element 124, the second adhesive layer 126b, and the back sheet 122 are sequentially stacked.

The silicon solar cell element 124 may be solar cells connected in series and in parallel. The silicon solar cell element 124 may be a polycrystalline or single-crystalline silicon solar cell.

The glass 129 may be a cover glass plate, and may contain sodium (Na). The sodium may be moved to the transparent conductive material layer 128 by a high voltage, applied to the glass, to chemically react with the transparent conductive material layer when the module is dismantled.

The adhesive layer 126 may include a first adhesive layer 126a and a second adhesive layer 126b. The first adhesive layer 126a and the second adhesive layer 126b may be ethylene-vinyl acetate (EVA), polyvinyl butyral (PVB), silicones, thermoplastic silicone elastomer (TPSE), thermoplastic polyolefin elastomer (TPO), or ionomers.

The transparent conductive material layer 128 is, preferably, a transparent conductive layer such as an aluminum-zinc oxide (ZnO:Al), an indium-tin oxide (ITO), a fluorine-doped tin oxide (FTO), an indium zinc oxide (IZO), or the like, which is a transparent conductive oxide electrode. The transparent conductive material layer 128 may have an exposed region, not being covered with the first adhesive layer 126, on an edge of the glass 129. The exposed region 128a may be used for electrical connection when the module is dismantled.

The back sheet may be polytetrafluoroethylene (PTFE), polyethylene terephthalate (PET), or polyvinyl fluoride (PVF).

A frame 110 may bind the glass 129 and the back sheet 122 with a metal material such as aluminum.

The transparent conductive material layer 128 may be decomposed to separate the glass 129 from the solar cell module without breakage of the solar cell module. When an existing waste module is recycled, the waste module is crushed and then divided into respective elements through separating and refining processes. Since components are damaged and contaminated during the separating and refining processes, refinement and reprocessing for reuse are required. Meanwhile, when a corresponding technology is used, components are easily separated, which is economical.

Figure 2:
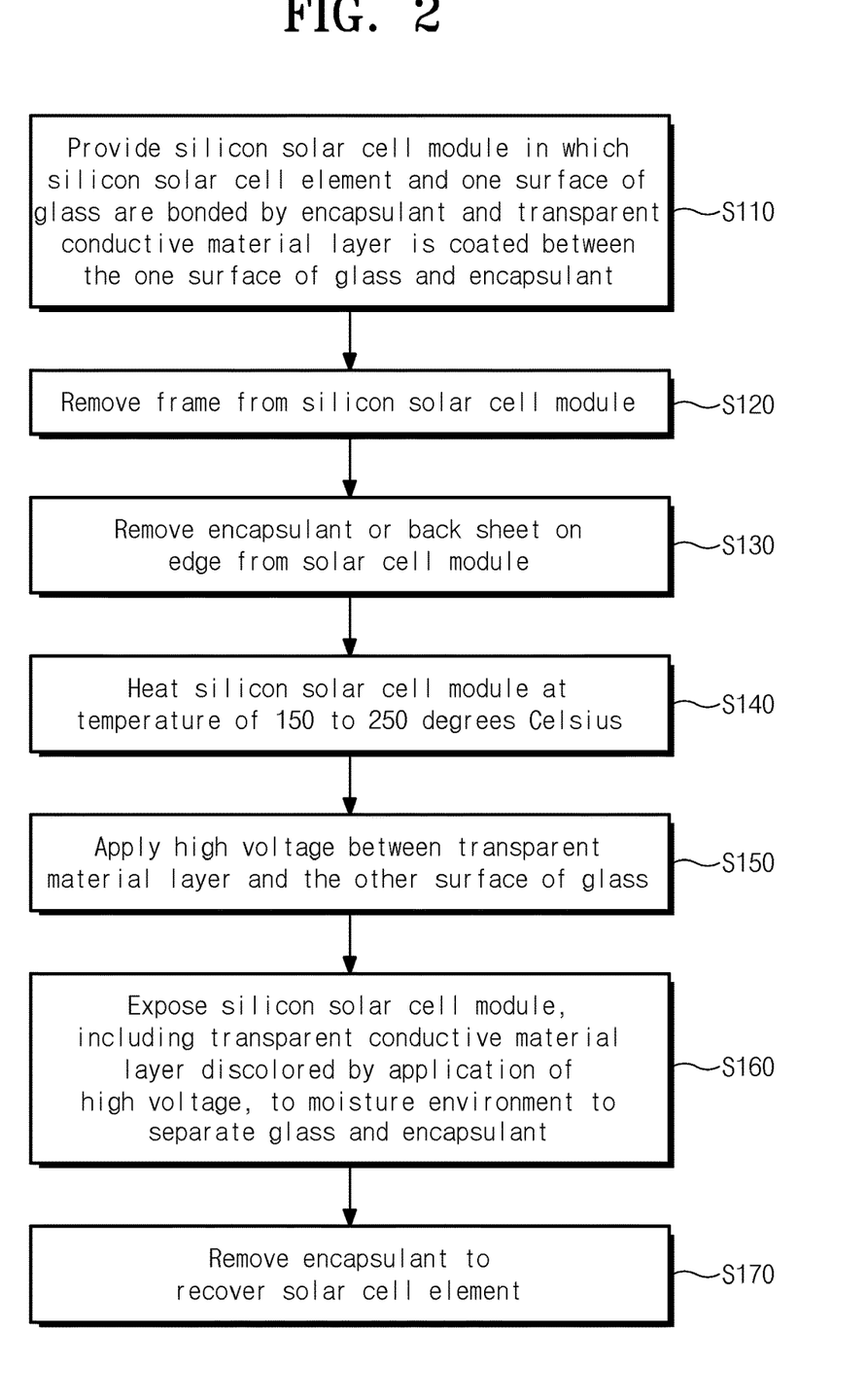
FIG. 2 is a flowchart illustrating a flow of dismantling a silicon solar cell module according to an embodiment of the present disclosure.

FIG. 2 is a flowchart illustrating a flow of dismantling a silicon solar cell module according to an embodiment of the present disclosure.

Figure 3:
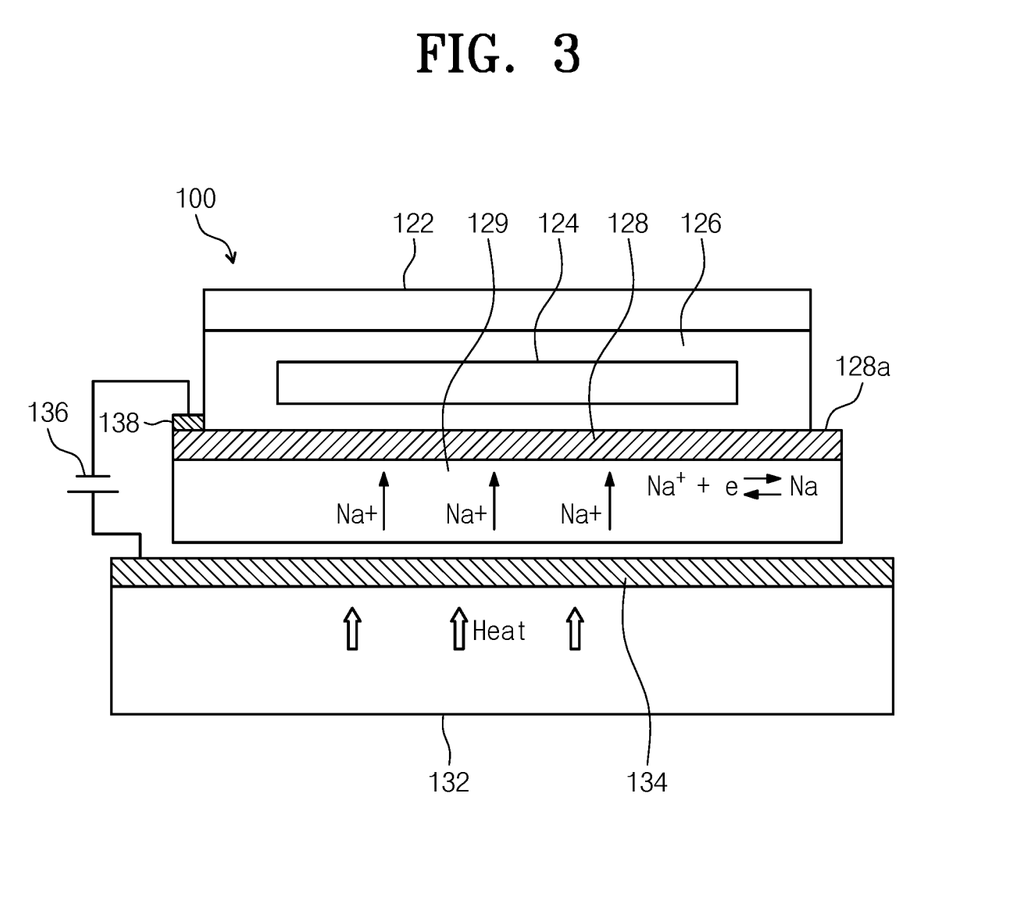
FIGS. 3 to 5 illustrate dismantling of a silicon solar cell module according to another embodiment of the present disclosure.
Figure 4:
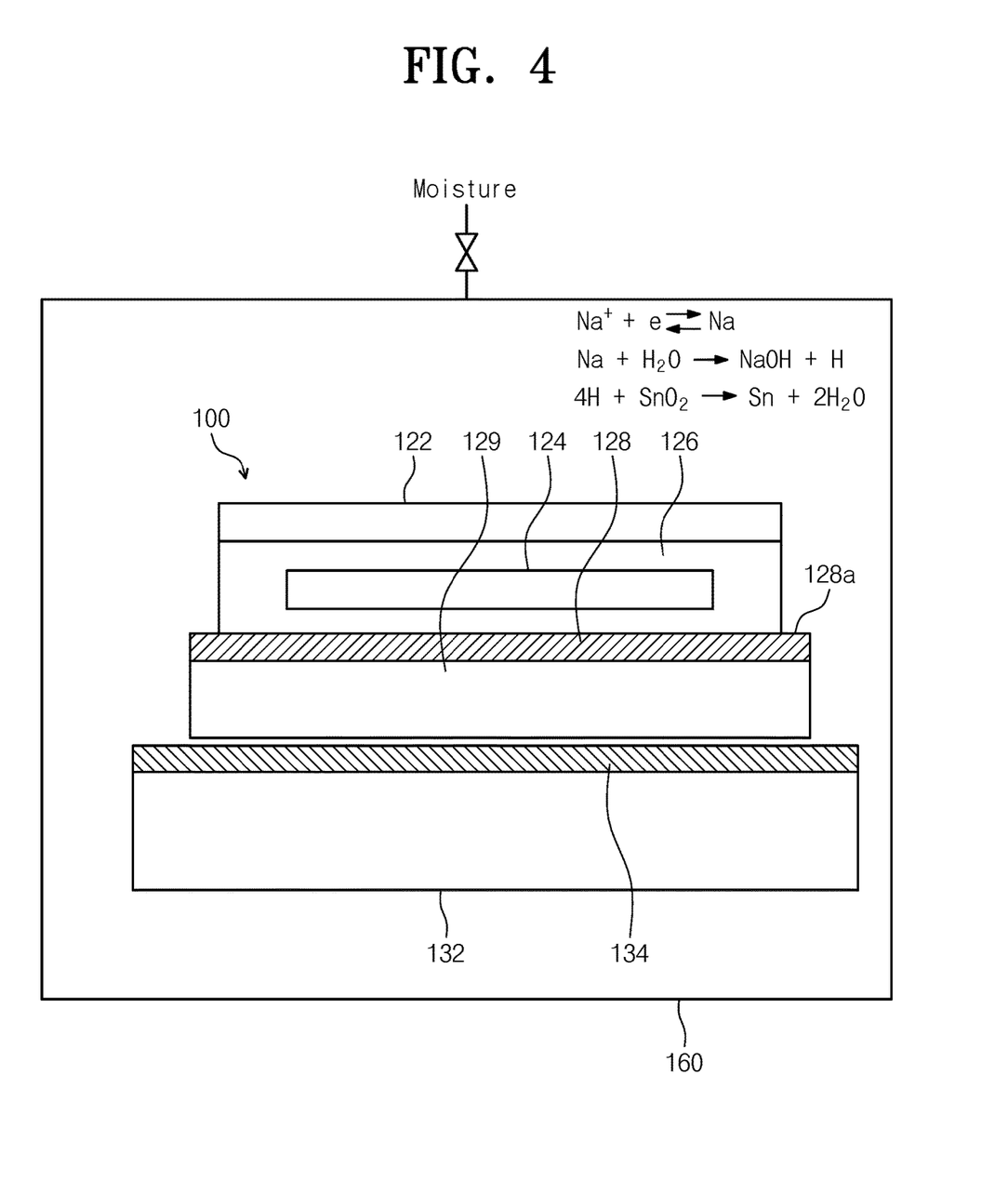
Figure 5:
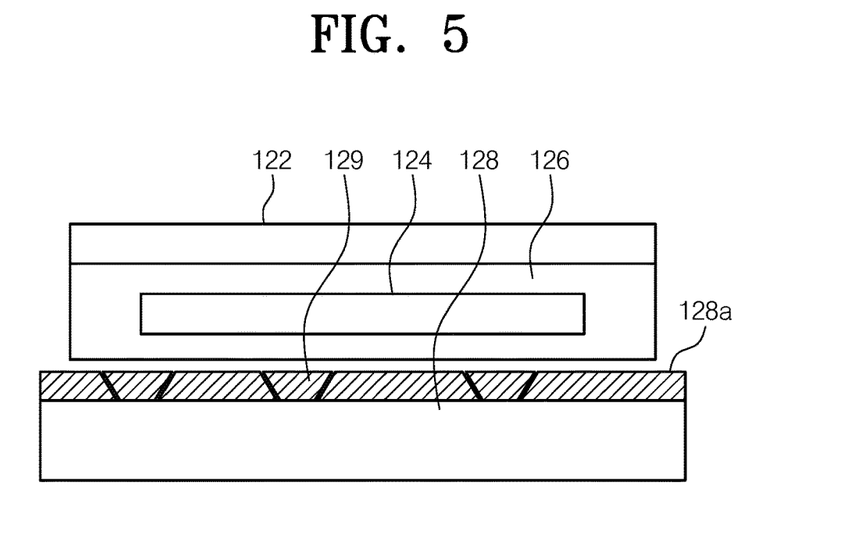

FIGS. 3 to 5 illustrate dismantling of a silicon solar cell module according to another embodiment of the present disclosure.

Referring to FIGS. 2 to 5, a method for dismantling a silicon solar cell module 100 includes providing a silicon solar cell module 100 in which a silicon solar cell element 124 and one surface of a glass 129 are bonded by an encapsulant 126 and a transparent conductive material layer 128 is coated between the one surface of the glass 129 and the encapsulant 126 (S110), applying a high voltage between the transparent conductive material layer 128 and the other surface of the glass 129 (S150), and exposing the silicon solar cell module 100, including the transparent conductive material layer discolored by application of the high voltage, to a moisture environment to separate the glass 129 and the encapsulant 126 (S160).

The transparent conductive material layer 128 is deposited on the glass 129. The silicon solar cell module 100 has a structure in which the glass 128, the transparent conductive material layer 128, the first adhesive layer 126a, a silicon solar cell element 124, a second adhesive layer 126b, and a back sheet are sequentially stacked. The silicon solar cell module 100 to be dismantled is prepared.

A frame is removed from the silicon solar cell module 100 to be dismantled (S120).

Before applying a high voltage between the transparent conductive material layer 128 and the other surface of the glass 129, an encapsulant or a back sheet 122 on an edge may be removed from the silicon solar cell module. When the silicon solar cell module 100 does not include an exposed region 128a of the transparent conductive material layer 128, the encapsulant covering the transparent conductive material layer 128 is removed to form the exposed region 128a. When each of the back sheet 122 and the encapsulant 126 has a smaller size than the glass 129, the exposed region 128a of the transparent conductive material layer 128 may be used as a voltage application site.

After the silicon solar cell module 100 to be dismantled is mounted on a hot plate 132, the hot plate 132 may be heated to 150 to 250 degrees Celsius. The silicon solar cell module may be heated to a temperature of 150 to 250 degrees Celsius while applying a high voltage between the transparent conductive material layer 128 and the other surface of the glass 129.

Simultaneously with the heating or after the heating, a high voltage is applied between the transparent conductive material layer 128 and the other surface of the glass 129. The other surface of the glass 129 is in contact with an electrode plate 134 disposed on the hot plate 132. In order to apply a voltage to the transparent conductive material layer 128, an electrode pad 138 may be used for stable electrical contact.

The transparent conductive material layer may be a cathode (−), while the other surface of the glass 129 or the electrode plate 134 may be an anode (+). A high voltage is applied through a DC power supply 136. The high voltage is applied for several minutes to several hours. The high voltage may be 100 volts to 1000 volts. The electrode plate 134 is a metal having improved electrical conductivity such as gold (Au), silver (Ag), aluminum (Al), titanium (Ti), copper (Cu), alloy stainless steel, or nickel steel. A negative voltage is applied to the transparent conductive material layer 128, a positive voltage is applied to the other surface of the glass, and the high voltage may be 100 volts to 1000 volts. When an electric field is applied to the glass 129, sodium (Na) ions contained in the glass 129 are transferred to the transparent conductive material layer 128. The transferred Na ions meet electrons of the transparent conductive material layer 128 to be reduced. The glass, containing the reduced Na, is discolored into brown.

The silicon solar cell module, including a transparent conductive material layer 128 discolored by application of the high voltage, may be exposed to a moisture environment to separate the glass 129 and the encapsulant 126 (S160). The moisture environment may have a relative humidity (RH) of 50 to 100 percent. For the moisture environment, the silicon solar cell module including the discolored transparent conductive material layer 128 may be disposed inside the chamber 160. The reduced sodium (Na) meets moisture (an RH of 50 to 100%) to help reduction of the transparent conductive material layer 128. Specifically, the sodium (Na) reacts with moisture to generate hydrogen, and the generated hydrogen reacts with the transparent conductive material layer 128 to generate water and metal. Accordingly, the transparent conductive material layer 128 is peeled off, and the adhesive 126 and the glass 129 are separated from each other.

Then, the encapsulant 126 may be removed from the silicon solar cell module 100 from which the glass 129 is separated. Removal of the encapsulant 126 may be performed using an organic solvent. Accordingly, the silicon solar cell element 124 is separated. The solar cell element 124 may be recycled.

Figure 6:
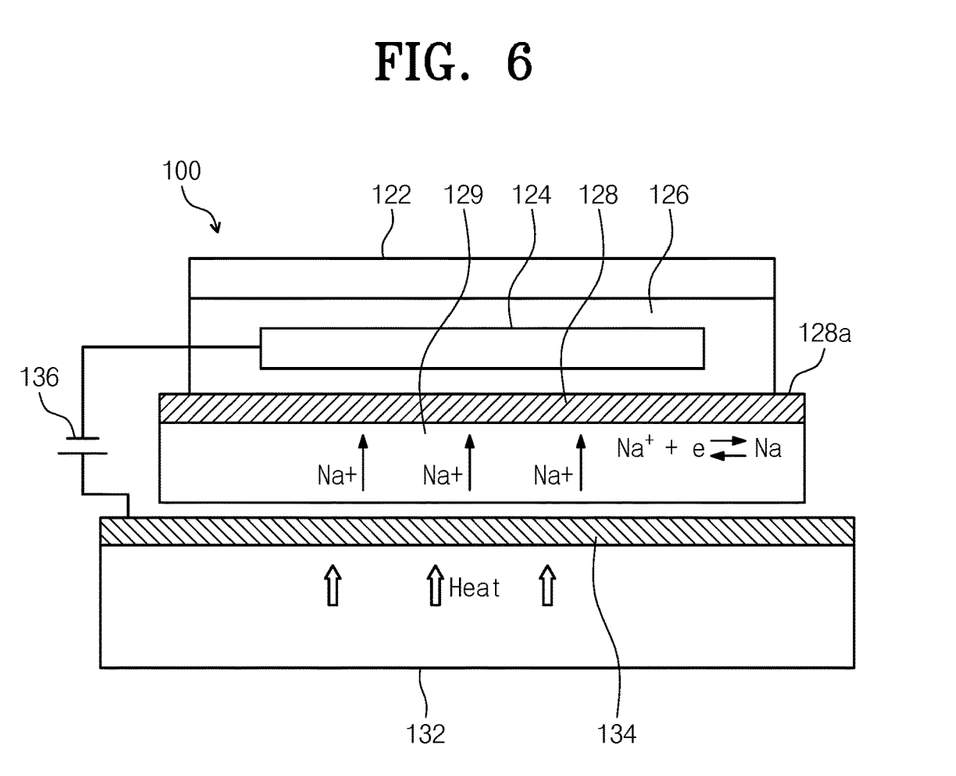
FIG. 6 illustrates dismantling of a silicon solar cell module according to another embodiment of the present disclosure.

FIG. 6 illustrates dismantling of a silicon solar cell module according to another embodiment of the present disclosure.

Referring to FIG. 6, a method of dismantling a silicon solar cell module 100 includes providing a silicon solar module in which one surface of a silicon solar cell element and a glass are bonded by an encapsulant and a transparent conductive material layer is coated between the one surface of the glass and the encapsulant (S110), applying a high voltage between the transparent conductive material layer and the other surface of the glass (S150), and exposing the silicon solar cell module, including the transparent conductive material layer discolored by application of the high voltage, to a humid environment to separate the glass and the encapsulant (S160).

The silicon solar cell element 124 may be a cathode (−), while the other surface of the glass 129 or the electrode plate may be an anode (+). In a method of the cathode (−), an electrode may be directly connected to an end of a ribbon or a junction box to which electrodes of solar cell elements constituting the module are connected.

The high voltage is applied via a DC power supply 136. Accordingly, the voltage is applied to both surfaces of the glass, so that sodium (Na) ions contained in the glass are transferred to the transparent conductive material layer, and the transferred Na ions meet electrons of the transparent conductive material layer to be reduced. The glass containing the reduced Na is discolored into brown.

A crystalline silicon solar cell uses additional cover glass for mounting. However, in a thin-film type solar cell, a transparent electrode and a semiconductor layer may be formed on a glass substrate without use of additional cover glass. Such a thin-film type solar module may also be dismantled in the same manner using the above-described electrochemical reaction.

Figure 7:
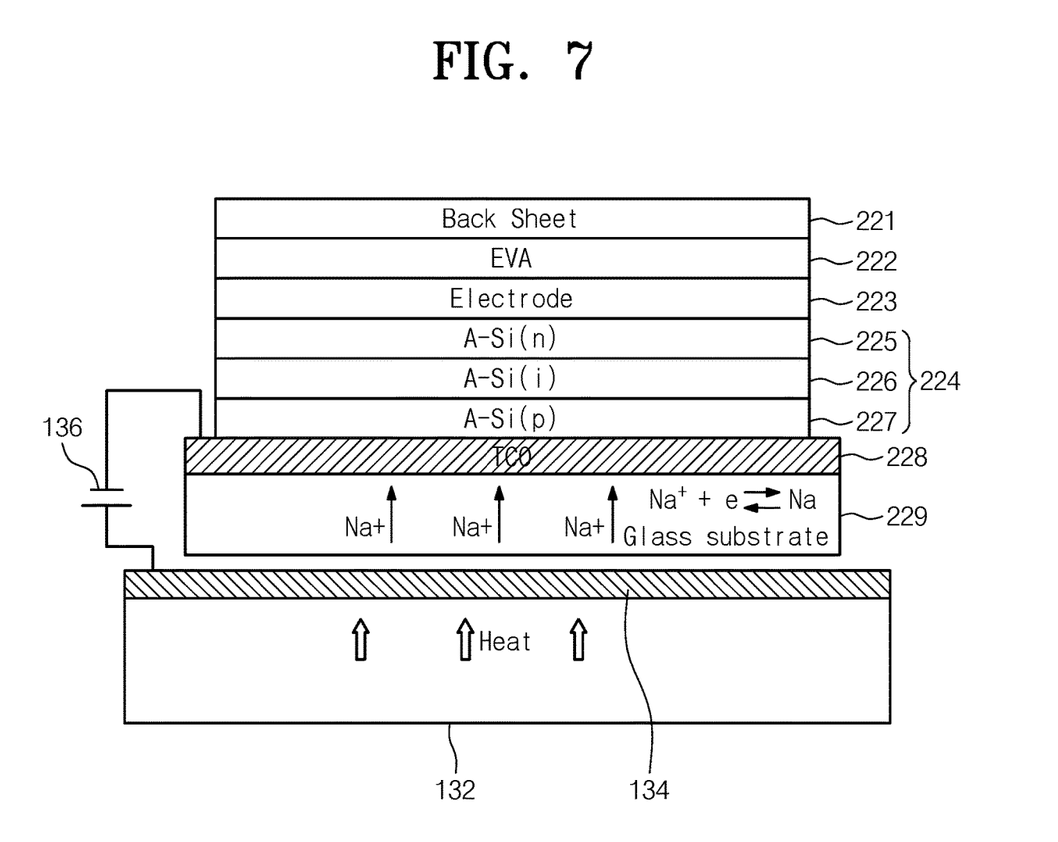
FIG. 7 illustrates a method for dismantling a thin-film type solar cell module according to another embodiment of the present disclosure.

FIG. 7 illustrates a method for dismantling a thin-film type solar cell module according to another embodiment of the present disclosure.

Referring to FIG. 7, a thin-film type solar cell module 200 includes a transparent conductive material layer 228 and a semiconductor layer 224 sequentially stacked on a glass substrate 229. A method for dismantling the thin-film type solar cell module 200 includes applying a high voltage between the transparent conductive material layer 228 and an exposed surface of the glass substrate 229 and exposing the thin-film type silicon solar cell module 200, including the transparent conductive material layer discolored by application of the high voltage, to a humid environment to separate the glass substrate 229 and the semiconductor layer 224.

The thin-film type solar cell module 200 may be an amorphous silicon solar cell or a CdTe solar cell. The thin-film type solar cell module 200 includes a transparent conductive material layer 228, a semiconductor layer 224, and a rear electrode 223, an encapsulant 222, and a back plate 221, sequentially stacked on a glass substrate 229. In the case of an amorphous silicon semiconductor, the semiconductor layer 224 may include a p-type semiconductor 227, an intrinsic semiconductor 226, and an n-type semiconductor 225, sequentially stacked. The rear electrode 223 may be a metal electrode, the encapsulant 222 may be an EVA, and the back plate 221 may be a metal plate.

The thin-film type solar cell module 200 may be heated to a temperature of 150 to 250 degrees Celsius while applying a high voltage between the transparent conductive material layer 228 and the other surface of the glass substrate 229. The other surface of the glass substrate 229 is in contact with the electrode plate 134 disposed on a hot plate 132. A negative voltage may be applied to the transparent conductive material layer 228, a positive voltage may be applied to the other surface of the glass substrate 229, and the high voltage may be 100 volts to 1000 volts. Sodium (Na) ions, contained in the glass substrate, are transferred to the transparent conductive material layer 228, and the transferred Na ions meet electrons of the transparent conductive material layer 228 to be reduced. The glass substrate 229, containing the reduced Na, is discolored into brown.

The moisture environment may have a relative humidity (RH) of 50 to 100 percent. Accordingly, the reduced sodium (Na) meets moisture (an RH of 50 to 100%) to help reduction of the transparent conductive material layer 228. Specifically, the sodium (Na) reacts with moisture to generate hydrogen, and the generated hydrogen reacts with the transparent conductive material layer 228 to generate water and metal. Accordingly, the transparent conductive material layer 228 is peeled off, and an adhesive and the glass 229 are separated from each other.

As described above, in a method for dismantling a silicon solar cell module according to an embodiment, glass and a solar cell element are separated without crushing the silicon solar cell module. Thus, the glass and the silicon solar cell element may be recovered as it is.

A method for dismantling a silicon solar cell module according to an embodiment is economical because a crushing process and a refinement process may be reduced.

In a method for dismantling a silicon solar cell module according to an embodiment, a high-temperature process is not used to prevent damage to a solar cell during separation of glass.

In a method for dismantling a silicon solar cell module according to an embodiment, a bulk and a weight are decreased during transportation for recycling a solar cell after removal of glass. As a result, transportation costs may be reduced.

Although the present disclosure and its advantages have been described in detail, it should be understood that various changes, substitutions and alterations can be made herein without departing from the spirit and scope of the disclosure as defined by the following claims.

What is claimed is:

1. A method for dismantling a silicon solar cell module, the method comprising:
   providing a silicon solar cell module in which a silicon solar cell element and one surface of a glass are bonded by an encapsulant and a transparent conductive material layer is coated between the one surface of the glass and the encapsulant;

applying a high voltage between the transparent conductive material layer and the other surface of the glass; and exposing the silicon solar cell module, including the transparent conductive material layer discolored by application of the high voltage, to a moisture environment to separate the glass and the encapsulant.

2. The method as set forth in claim 1, wherein the moisture environment has a relative humidity of 50 to 100 percent.

3. The method as set forth in claim 1, further comprising:
heating the silicon solar cell module at a temperature of 150 to 250 degrees Celsius.

4. The method as set forth in claim 1, wherein the transparent conductive material layer is applied with a negative voltage, and the other surface of the glass is applied with a positive voltage, and
the high voltage is 100 volts to 1000 volts.

5. The method as set forth in claim 1, further comprising:
removing the encapsulant and a back sheet on an edge from the silicon solar cell module before applying the high voltage between the transparent conductive material layer and the other surface of the glass.

6. The method as set forth in claim 1, further comprising:
removing the encapsulant from the silicon solar cell module from which the glass is separated.

7. The method as set forth in claim 1, wherein in the applying a high voltage between the transparent conductive material layer and the other surface of the glass, a voltage is directly applied to the other surface of the glass or the transparent conductive material layer, or a voltage is directly applied to the other surface of the glass and the silicon solar cell element.

8. A method for dismantling a thin-film type solar cell module including a transparent material layer and a semiconductor layer sequentially stacked on a glass substrate, the method comprising:
applying a high voltage between the transparent conductive material layer and an exposed surface of the glass substrate; and exposing the thin-film type silicon solar cell module, including the transparent conductive material layer discolored by application of the high voltage, to a humid environment to separate the glass substrate and the semiconductor layer.

9. The method as set forth in claim 8, wherein the humidity environment has a relative humidity of 50 to 100 percent.

10. The method as set forth in claim 8, further comprising:
heating the thin-film type solar cell module at a temperature of 150 to 250 degrees Celsius while applying a high voltage between the transparent conductive material layer and the other surface of the glass substrate.

11. The method as set forth in claim 8, wherein the transparent conductive material layer is applied with a negative voltage, and the other surface of the glass substrate is applied with a positive voltage, and
the high voltage is 100 volts to 1000 volts.

* * * * *